US010629768B2

(12) United States Patent
Clevenger et al.

(10) Patent No.: US 10,629,768 B2
(45) Date of Patent: Apr. 21, 2020

(54) ASSEMBLY AND MOUNTING OF SOLAR CELLS ON SPACE VEHICLES OR SATELLITES

(71) Applicant: SolAero Technologies Corp., Albuquerque, NM (US)

(72) Inventors: Marvin B. Clevenger, Albuquerque, NM (US); Cory Tourino, Edgewood, NM (US); Benjamin Richards, Hudson, NH (US)

(73) Assignee: SolAero Technoloies Corp., Albuquerque, NM (US)

( * ) Notice: Subject to any disclaimer, the term of this patent is extended or adjusted under 35 U.S.C. 154(b) by 0 days.

(21) Appl. No.: 16/196,765

(22) Filed: Nov. 20, 2018

(65) Prior Publication Data

US 2019/0088815 A1  Mar. 21, 2019

Related U.S. Application Data

(60) Division of application No. 15/241,418, filed on Aug. 19, 2016, now Pat. No. 10,276,742, which is a continuation-in-part of application No. 14/795,461, filed on Jul. 9, 2015, now Pat. No. 9,608,156.

(51) Int. Cl.
*H01L 31/18* (2006.01)
*H01L 31/042* (2014.01)
*H01L 31/048* (2014.01)
*H01L 31/049* (2014.01)

(52) U.S. Cl.
CPC ........ *H01L 31/1876* (2013.01); *H01L 31/042* (2013.01); *H01L 31/048* (2013.01); *H01L 31/049* (2014.12); *Y02E 10/50* (2013.01); *Y02P 70/521* (2015.11)

(58) Field of Classification Search
CPC .............. H01L 31/049; H01L 31/0516; H01L 31/0504; H01L 31/0508; H01L 31/022425
See application file for complete search history.

(56) References Cited

U.S. PATENT DOCUMENTS

| | | | |
|---|---|---|---|
| 5,720,452 A * | 2/1998 | Mutschler, Jr. ........ | B64G 1/222 244/172.7 |
| 5,961,738 A | 10/1999 | Benton et al. | |
| 6,300,158 B1 | 10/2001 | Simburger et al. | |
| 9,919,815 B2 * | 3/2018 | Steele .................... | B64G 1/443 |
| 2010/0330731 A1 * | 12/2010 | Agarwal ........... | H01L 31/02008 438/73 |
| 2011/0083716 A1 * | 4/2011 | Meakin ................. | H01L 31/048 136/244 |
| 2012/0024341 A1 * | 2/2012 | Luch ................... | H01L 31/0392 136/244 |
| 2012/0103388 A1 * | 5/2012 | Meakin ..................... | B32B 7/14 136/244 |
| 2012/0156824 A1 * | 6/2012 | Streett ................... | H01L 31/049 438/66 |

(Continued)

*Primary Examiner* — Zandra V Smith
*Assistant Examiner* — John M Parker

(57) ABSTRACT

Solar cell array assemblies or modules mounted on a space vehicle having discrete predefined pressure sensitive adhesive (PSA) regions thereon. In certain embodiments, the solar cell array modules may be conveniently mounted on the surface of a panel of a space vehicle or satellite with the discrete predefined PSA regions sized and shaped to match portions of the panel.

13 Claims, 10 Drawing Sheets

(56) References Cited

U.S. PATENT DOCUMENTS

| | | | |
|---|---|---|---|
| 2012/0227809 A1* | 9/2012 | Bharti | H01L 31/02167 |
| | | | 136/259 |
| 2013/0014802 A1* | 1/2013 | Zimmerman | H01L 31/022425 |
| | | | 136/244 |
| 2013/0074330 A1* | 3/2013 | Tucholski | H01M 2/30 |
| | | | 29/832 |
| 2015/0007889 A1* | 1/2015 | Buzoujima | H01L 31/048 |
| | | | 136/259 |
| 2016/0194072 A1* | 7/2016 | Cornew | B64C 39/024 |
| | | | 136/244 |
| 2016/0359079 A1* | 12/2016 | Clevenger | H01L 31/047 |

* cited by examiner

ASSEMBLY AND MOUNTING OF SOLAR CELLS ON SPACE VEHICLES OR SATELLITES

REFERENCE TO RELATED APPLICATIONS

The present application is a divisional of U.S. patent application Ser. No. 15/241,418 filed Aug. 19, 2016, which is a continuation-in-part of U.S. patent application Ser. No. 14/795,461, filed Jul. 9, 2015, now U.S. Pat. No. 9,608,156.

The present application is related to U.S. patent application Ser. No. 14/592,519, filed Jan. 8, 2015, and Ser. No. 14/719,111, filed May 21, 2015.

All of the above related applications are incorporated herein by reference in their entireties.

BACKGROUND OF THE DISCLOSURE

1. Field of the Disclosure

The present disclosure relates to the field of photovoltaic solar arrays, and more particularly to fabrication processes utilizing, for example, multijunction solar cells based on III-V semiconductor compounds fabricated into interconnected Cell-Interconnect-Cover Glass (CIC) assemblies and mounted on a support or substrate using automated processes.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

One or more III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Conventional space solar array panels at present are most often comprised of a relatively densely packed arrangement of solar cells generally the size of the semiconductor wafer (typically 100 or 150 mm in diameter) mounted on a rigid supporting panel and operating without lenses for optical concentration of sunlight. A conventional space solar array panel may include a panel or support, solar cell assemblies disposed on the support, interconnection components for connecting the solar cell assemblies, and bypass diodes and blocking diodes also connected to the solar cells.

Individual solar cells, frequently with a rectangular or generally square-shape and sometimes with cropped corners, are connected in series to form a string of solar cells, whereby the number of solar cells used in the string determines the output voltage. Solar cells or strings of solar cells can also be interconnected in parallel, so as to increase the output current. Individual solar cells are provided with interconnects and a cover glass so as to form so-called CICs (Cell-Interconnect-Cover Glass) assemblies, which are then combined to form an array. Conventionally, these large solar cells have been mounted on a support and interconnected using a substantial amount of manual labor. For example, first individual CICs are produced with each interconnect individually welded to each cell, and each cover glass individually mounted. Then, these CICs are connected in series to form strings, generally in a substantially manual manner, including welding or soldering steps. Then, these strings are applied to a panel or substrate and interconnected, in a process that includes the application of adhesive, wiring, and other assembly steps.

Close packing of the large solar cells on the space solar array panel is challenging due to requirement for interconnection of the solar cells to form a series circuit and to implement and interconnect the bypass diodes. An additional challenge can sometimes reside in the need to interconnect a plurality of strings of series connected solar cells in parallel. All of this has traditionally been carried out in a manual and substantially labor-intensive manner.

Accordingly, the present disclosure provides improved methods of manufacturing and assembling photovoltaic solar arrays that can result in decreases in cost, greater compactness, and increases in performance.

SUMMARY OF THE DISCLOSURE

3. Objects of the Disclosure

It is an object of the present disclosure to provide an automated process for producing solar cell panels for space applications.

It is another object of the present disclosure to provide an automated assembly tool for producing solar cell panels for space applications.

It is an object of the disclosure to provide a supply cassette including a plurality of solar cell assemblies connected in series and that can be used in an automated process to form a solar array panel by automatically placing and adhering said solar cell assemblies to the support.

It is another object of the disclosure to provide a method for making a solar cell panel.

It is another object of the disclosure to provide for an assembly structure and method that facilitates automation of at least certain steps of the process for manufacture of solar cell assemblies or CICs and panels of interconnected CICs.

Some implementations of the present disclosure may incorporate or implement fewer of the aspects and features noted in the foregoing objects.

SUMMARY OF THE DISCLOSURE

Briefly, and in general terms, the present disclosure provides solar cell array modules, and methods of making and using solar cell array modules, having discrete predefined pressure sensitive adhesive (PSA) regions thereon. In certain embodiments, the solar cell array modules may be conveniently mounted on a space vehicle or satellite with the discrete predefined PSA regions.

In one embodiment, the present disclosure provides a method of fabricating a solar cell array module comprising: providing a release carrier having a sequence of pressure sensitive adhesive (PSA) patches on a first side of the release carrier; contacting the PSA patches on the first side of the release carrier with a first side of a flexible support and under conditions effective to transfer the PSA patches to the first side of the flexible support using an automated process to form discrete predefined PSA regions on the first side of the flexible support; and contacting the PSA regions on the first side of the flexible support with a first side of a release carrier having a sequence of solar cell assemblies thereon under conditions effective to transfer the solar cell assemblies to the PSA regions on the first side of the flexible support using an automated process to attach the sequence of solar cell assemblies to the first side of the flexible support using the PSA regions to prepare a patterned solar cell array. Optionally, the method further includes providing a pressure sensitive adhesive on the second side of the flexible support.

In some embodiments, the release carrier having the sequence of pressure sensitive adhesive (PSA) patches on the first side of the release carrier is provided on a cassette or spool.

In some embodiments, conditions effective to transfer the PSA patches to the first side of the flexible support comprise: unwinding the release carrier having the sequence of pressure sensitive adhesive (PSA) patches on the first side of the release carrier from the cassette or spool and passing the release carrier through a first automated assembly device in a first direction, wherein the first automated assembly device has two rollers rotating in the same direction; and passing the flexible support through the first automated assembly device in a direction opposite the first direction in which the release carrier passes through the first automated assembly device; wherein the PSA patches on the first side of the release carrier are contacted with a first side of a flexible support and pressure from the two rollers is effective to transfer the PSA patches to the first side of the flexible support to form discrete predefined PSA regions on the first side of the flexible support.

In some embodiments, the release carrier having a sequence of solar cell assemblies on the first side thereof is provided on a cassette or spool.

In some embodiments, conditions effective to transfer the solar cell assemblies to the PSA regions on the first side of the flexible support comprise: unwinding the release carrier having the sequence of solar cell assemblies on the first side thereof from the cassette or spool and passing the release carrier through a second automated assembly device in a first direction, wherein the second automated assembly device has two rollers rotating in opposite directions; and passing the flexible support having a pattern of discrete predefined pressure sensitive adhesive (PSA) regions on a first side of the flexible support through the second automated assembly device in the same direction as the first direction in which the release carrier having the sequence of solar cell assemblies on the first side thereof passes through the second automated assembly device; wherein the solar cell assemblies on the first side of the release carrier are contacted with the first side of the flexible support having a pattern of discrete predefined pressure sensitive adhesive (PSA) regions, and pressure from the two rollers is effective to attach the sequence of solar cell assemblies to the PSA regions on the first side of the flexible support to prepare a patterned solar cell array.

In some embodiments, the pressure sensitive adhesive on the second side of the support is patterned. In some embodiments, the pattern of the pressure sensitive adhesive on the second side of the support are in the shape of and congruent to the shape of the surface of a space vehicle or satellite. In some embodiments, preparing the pattern of the pressure sensitive adhesive on the second side of the support is performed using an automated process.

In another embodiment, the present disclosure provides a method of fabricating a solar cell array module comprising: providing an aluminum honeycomb support with a carbon composite face sheet having an array of solar cell assemblies mounted on the face sheet; providing a pattern of discrete predefined pressure sensitive adhesive (PSA) regions on the side of the support opposite the face sheet; and providing a release liner adjacent the discrete predefined pressure sensitive adhesive (PSA) regions on the side of the support opposite the face sheet.

In another aspect, the present disclosure provides a solar cell array module comprising: a support having an array of solar cells mounted on a first side of the support and a pattern of discrete predefined pressure sensitive adhesive (PSA) regions on a second side of the support; and a release liner adjacent the discrete predefined pressure sensitive adhesive (PSA) regions on the second side of the support.

In another aspect, the present disclosure provides a method of mounting a solar cell array module on a space vehicle or satellite comprising: providing a solar cell array module as described herein; removing the release liner; placing the discrete predefined pressure sensitive adhesive (PSA) regions of the solar cell array module adjacent a surface of the space vehicle; and applying pressure (e.g., manually or by an automated process).

In some embodiments, a plurality of solar cells are disposed closely adjacent to one another on each of the strips by a distance between 5 and 25 microns.

In some embodiments, each of the solar cells have a dimension in the range of 0.5 to 10 mm on a side.

In some embodiments of the disclosure, the support is a KAPTON® layer, that is, a polymide film layer. KAPTON® is a trademark of E.I. du Pont de Nemours and Company. The chemical name for KAPTON® is poly(4,4'-oxydiphenylene-pyromellitimide). Other polymide film sheets or layers may also be used.

In some embodiments, the support has a thickness of between 25 and 100 microns, or between 1 mil (25.4 µm) and 4 mil (101.6 µm).

In some embodiments, the metal layer is attached to the support layer in an adhesive-less manner, to limit outgassing when used in a space environment.

In some embodiments, a double-faced pressure-sensitive adhesive template or patch is positioned on the backside of the solar cell assembly.

In some embodiments the support is mounted on a metallic honeycomb structure.

In some embodiments, the double-faced pressure-sensitive adhesive template or patch is shaped so that the shape matches and is congruent to that of the peripheral outline of the solar cell assembly.

In some embodiments, the double-faced pressure-sensitive adhesive template or patch and the polyimide film are bonded together by a co-curing process.

In some embodiments, the double-faced pressure-sensitive adhesive template or patch is covered at least partially with a release liner which is removed before making the bonding with the substrate.

In some embodiments, the release liner is at least partially patterned so that it matches the shape of the double-faced pressure-sensitive adhesive template or patch.

In some embodiments the solar cell device and a substrate are automatically bonded together with at least one double-faced pressure adhesive patch, where the at least one double-faced pressure adhesive patch is at least partially positioned on backside of the solar cell device, in particular the interior of the solar cell device and/or at least partially positioned on the substrate before making the bonding connection.

In some embodiments the at least one double-faced pressure sensitive adhesive patch is applied to the substrate, in particular a polymer film, more particular a polyimide film, the shape of the at least one double-faced pressure sensitive adhesive patch patterned to match the shape of the at least one solar cell device.

In some embodiments, the solar cell device is automatically positioned on the substrate so that its shape essentially matches the shape of at least one double-faced pressure sensitive adhesive patch.

In some embodiments, after making the bonding connection at least two solar cell devices are automatically interconnected using a pick and place process for positioning the interconnectors, followed by automatic parallel gap welding.

In some embodiments the at least two solar cell devices are automatically electrically connected, in particular wire bonded together, the at least two solar cell devices having co-planar front-side electrical contacts.

In some embodiments, a single-layer pressure sensitive adhesive (PSA) film is used as a bonding adhesive to attach solar cells or solar cell assemblies to a solar panel.

In some embodiments, the PSA film may be a patterned or a continuous layer.

In some embodiments, the PSA film may be an acrylic or a silicone adhesive, or any other suitable material.

In some embodiments, the PSA film may have one or two release liners, or possibly no release liners.

In some embodiments, the substrate may be a rigid substrate, such as an aluminum honeycomb substrate with carbon composite face sheet, or it may be a flexible substrate, such as a polymide film.

In some embodiments, the PSA film may also be applied to the back of the solar cells or solar cell assemblies.

In some embodiments, a pressure sensitive adhesive (PSA) film is prepared as a single layer.

In some embodiments, the PSA film may be prepared onto a permanent flexible substrate, such as a polyimide, with a release liner or liners on the opposite side.

In some embodiments, there may be a multiplicity of individual PSA patterns, each with its own front and back release liners. In some embodiments, there may be a multiplicity of individual PSA patterns, with one single, continuous release liner on one side and a multiplicity of release liners on the opposite side.

In some embodiments, there may be a multiplicity of individual PSA patterns with two continuous release layers covering the multiplicity of patterns on both sides.

In some embodiments, there may be a single, continuous film of PSA with release liners on one or both sides.

In some embodiments, the PSA film is used to bond solar cells or solar cell assemblies to a substrate.

In some embodiments, the PSA film may be applied first to the substrate, and then the solar cells attached to the PSA film, or it may be applied first to the back of the solar cells, and then the solar cells with PSA film are applied to the substrate.

In some embodiments, if the PSA film is prepared on a permanent substrate, the solar cells or solar cell assemblies may be applied directly to the PSA film.

In some embodiments, the PSA film may have continuous release liners that are removed in one step, or it may have a multiplicity of release liners that are removed individually.

In some embodiments, the PSA may be a silicone adhesive, an acrylic adhesive, or any other material that may be suitable for a PSA.

In some embodiments, the PSA may be a patterned layer, or it may be a continuous layer.

For instance, the PSA may be patterned into the shape of solar cells.

In some embodiments, the assembly of polyimide-PSA-release liner is bonded directly to a solar panel substrate by co-curing the polyimide film to the face of the solar panel substrate. The solar panel substrate to which the polyimide is bonded may be an aluminum honeycomb substrate, and it may have a carbon composite or aluminum face sheet. It may be a rigid substrate, or it may be a flexible substrate.

In some embodiments, following the above described assembly, the substrate is ready to have the solar cells or solar cell assemblies bonded to it. The release liner is removed when it is time to bond the solar cells, which exposes the PSA, and the solar cells are bonded to the PSA and the substrate. Since the PSA thickness is precisely controlled during manufacturing, the bondline is uniform and there is less opportunity to entrap air than when a liquid adhesive is used.

In another aspect, the present disclosure provides a space vehicle and its method of fabrication comprising: a payload disposed on or within the space vehicle; and a power source for the payload, including an array of solar cell assemblies mounted on a panel, each solar cell assembly being of the type described above.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures.

DESCRIPTION OF ILLUSTRATIVE EMBODIMENTS

Figure 1A:
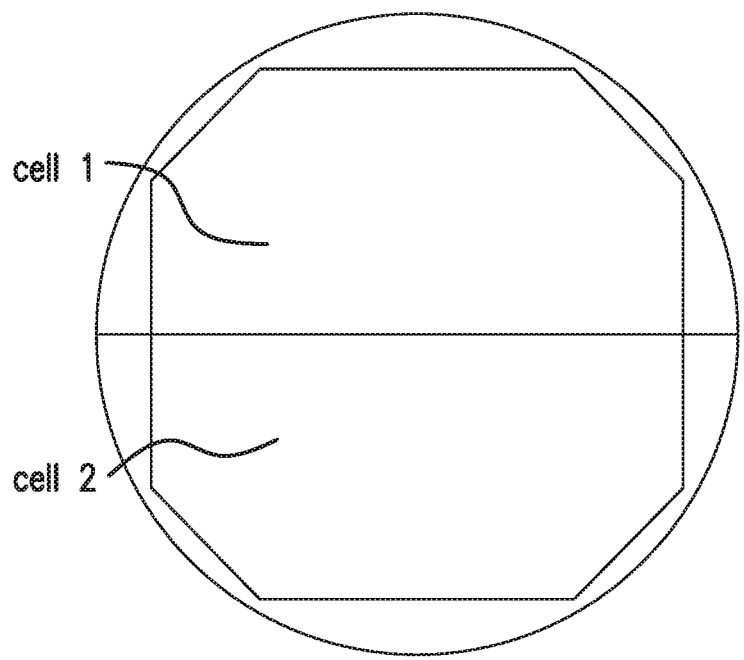
FIG. 1A is a top plan view of a wafer with two solar cells being implemented.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells are disclosed in the related applications noted above. Some, many or all of such features may be included in the structures and processes associated with the solar cells of the present disclosure. However, more particularly, the present disclosure is directed to several embodiments of mounting a plurality of solar cells to a support.

More generally, however, the present disclosure may be adapted to multijunction solar cells as disclosed in related applications that may include three, four, five, or six sub-cells, with band gaps in the range of 1.8 to 2.2 eV (or higher) for the top subcell; 1.3 to 1.8 eV and 0.9 to 1.2 eV for the middle subcells; and 0.6 to 0.8 eV for the bottom subcell, respectively.

The present disclosure provides a process for the design and fabrication of an array of covered-interconnect-cells or "CICs" using multijunction solar cells that improve manufacturing efficiency and/or performance. More specifically, the present disclosure intends to provide a relatively simple and reproducible technique that is suitable for use in a high volume production environment in which various semiconductor layers are deposited in an MOCVD reactor, and subsequent processing steps are defined and selected to minimize any physical damage to solar cell and the quality of the deposited layers, thereby ensuring a relatively high yield of operable solar cells meeting specifications at the conclusion of the fabrication processes.

FIG. 1A is a top plan view of a wafer with two solar cells (cell 1 and cell 2) being implemented. Such solar cells may be referred to as "half-wafer" cells.

Figure 1B:
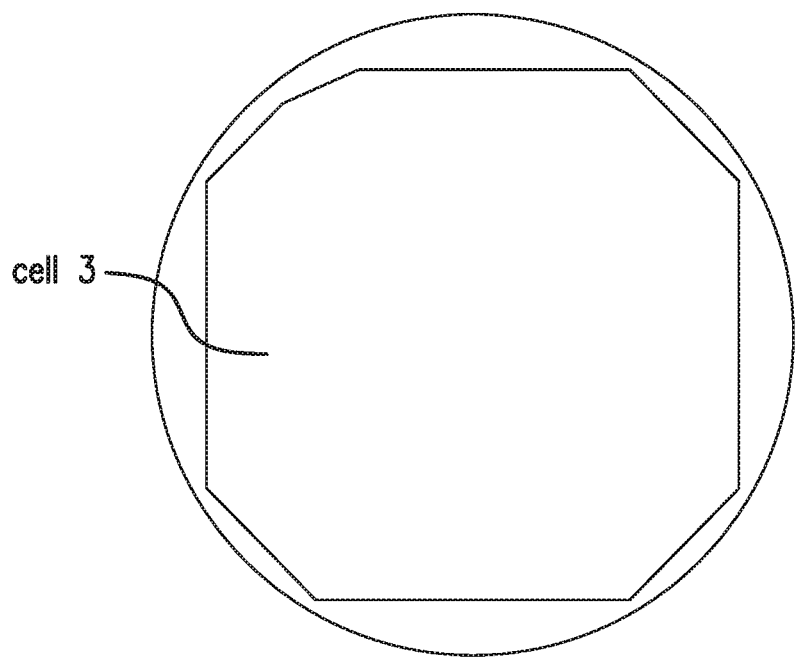
FIG. 1B is a top plan view of a wafer with a single solar cell being implemented.

FIG. 1B is a top plan view of a wafer with a single solar cell (cell 3) being implemented.

Figure 2:
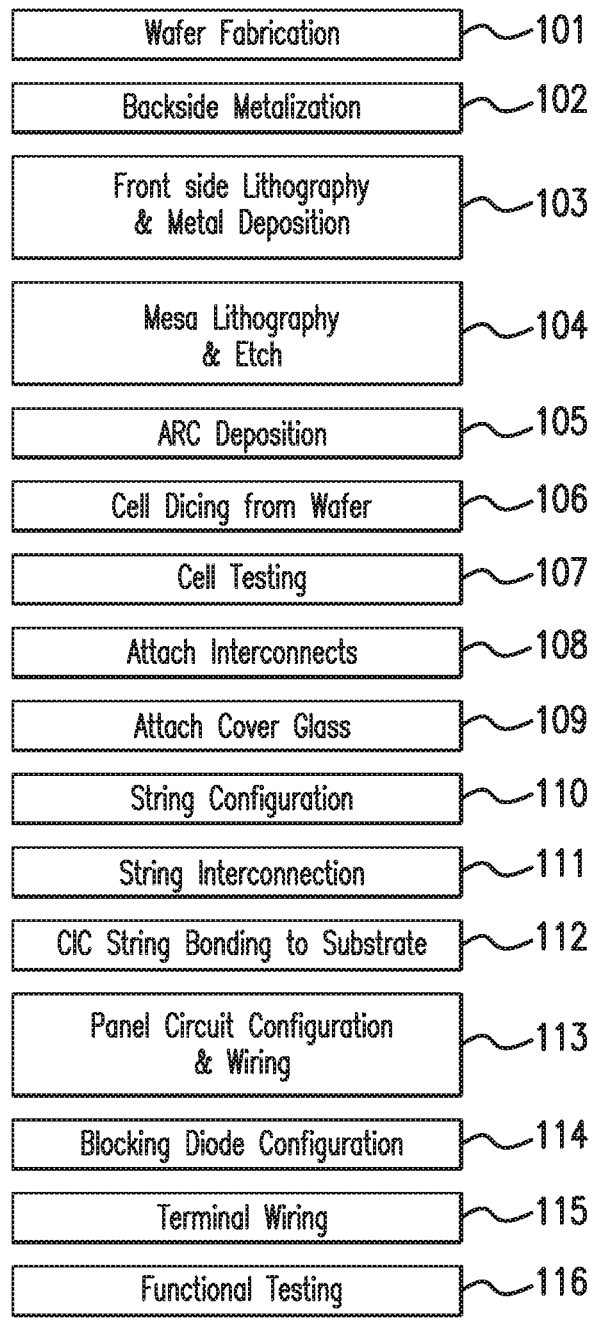
FIG. 2 is a listing of the sequence of steps in fabricating a solar cell and attaching it to a panel.

FIG. 2 is a flowchart representing a method in accordance with an embodiment of the present disclosure. Certain embodiments of the invention can include one or more of the method steps of wafer fabrication (101), backside metallization (102), front side lithography and metal deposition (103), mesa lithography and etch (104), antireflective coating (ARC) deposition (105), cell dicing from the wafer (106), cell testing (107), attaching interconnects and configuring and attaching bypass diodes (108), attaching cover glass to form CIC (109), forming string configuration (110), forming string interconnections (111), CIC string bonding to substrate (112), panel circuit configuration and wiring (113), blocking diode configuration (114), terminal wiring (115), and functional testing (116).

In certain embodiments of the present disclosure, one or more of the above-recited method steps may be performed using an automated process.

Solar cell configurations particularly suitable for assembly using automated processes include those that are described in U.S. patent application Ser. No. 14/592,519, filed Jan. 8, 2015; Ser. No. 14/719,111, filed May 21, 2015; Ser. No. 14/729,412, filed Jun. 3, 2015; and Ser. No. 14/729,422, filed Jun. 3, 2015, all of which are incorporated herein by reference in their entireties.

One or more solar cells can be formed from a wafer using conventional techniques such as dicing or scribing. The size and shape of the solar cells can be varied as desired for particular applications as disclosed, for example, in U.S. patent application Ser. No. 14/592,519, filed Jan. 8, 2015, which is incorporated herein by reference in its entirety. Dicing or scribing of solar cells from a wafer is particularly amenable to automation using machine vision.

Figure 3:
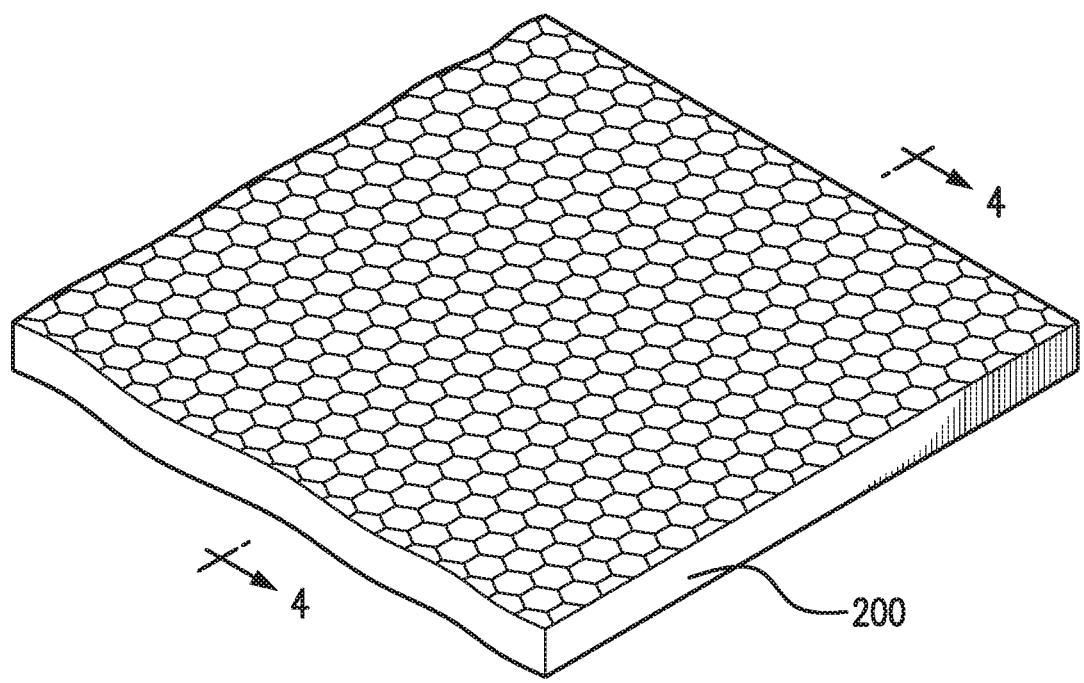
FIG. 3 is a perspective view of a honeycomb support of a panel.

FIG. 3 is a perspective view of a metallic honeycomb structure 200 which can be used for mounting a support.

Figure 4:
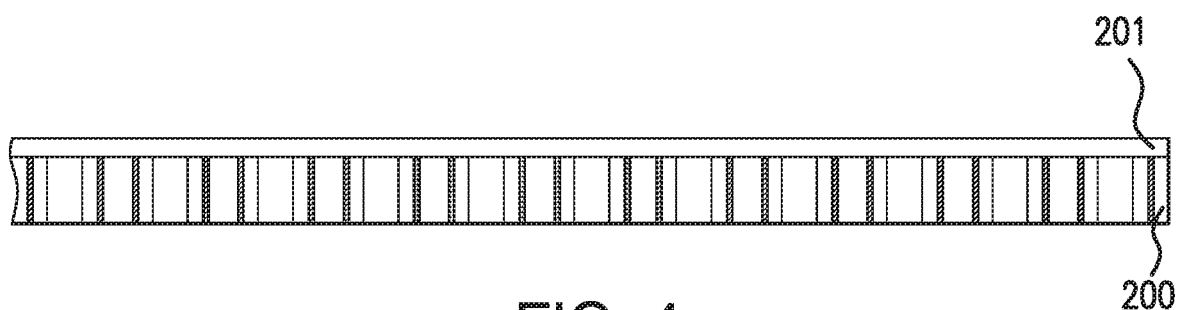
FIG. 4 is a cross-sectional view of a honeycomb panel of FIG. 3 with a carbon fiber face sheet.

FIG. 4 is a cross-sectional view of an aluminum honeycomb substrate 200 with carbon composite face sheet 201 attached thereto. In some embodiments, a double sided adhesive film can be positioned on the top surface of the face sheet, and the bottom surface of the adhesive film can be bonded to the top surface of the face sheet by, for example, co-curing. In some embodiments, a plurality of layers of carbon composite sheets can be embedded in a matrix of cyanate ester adhesive. The polyimide can then be put on top and the whole stack co-cured.

In some embodiments, a sequence of solar cell assemblies can be positioned over the top surface of the adhesive film, and each of the sequence of solar cell assemblies can be sequentially bonded to a predefined region on the top surface of the adhesive film, for example, by automatic application of pressure and/or heat. In some embodiments, the predefined region contains a pressure sensitive adhesive, and no adhesive is present on other regions of the top surface of the face sheet.

Figure 5:
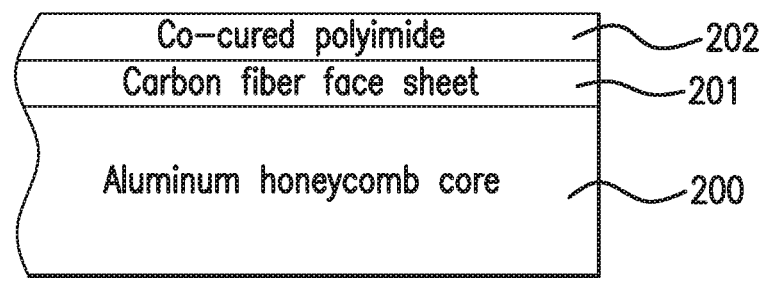
FIG. 5 is a cross-sectional view of the support assembly of FIG. 4 with a polyimide surface layer.

FIG. 5 is a cross-sectional view of an aluminum honeycomb substrate 200 with carbon composite face sheet 201 attached to aluminum honeycomb substrate 200, and co-cured polyimide substrate 202 attached to carbon composite face sheet 201.

Figure 6:
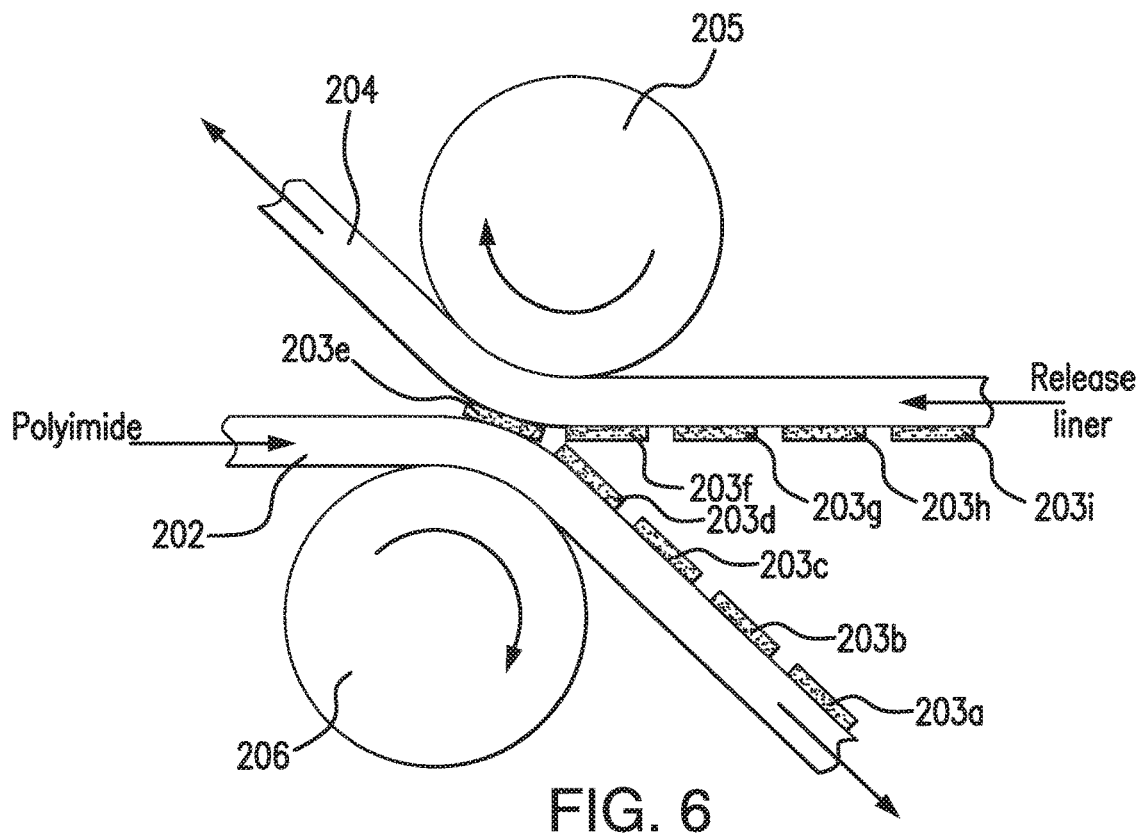
FIG. 6 is a cross sectional view of an assembly for applying the patterns of PSA patches to a polyimide sheet in an automated manner.

FIG. 6 is a cross sectional view of an assembly for applying patterns of PSA patches to a polyimide sheet in an automated manner. A sequence of PSA patches 203e, 203f, 203g, 203h, 203i, . . . are disposed on a first side of release carrier 204. The PSA patches 203e, 203f, 203g, 203h, 203i, . . . are placed in contact with a first side of polyimide sheet 202. A second side of release carrier 204 is in contact with roller 205, and a second side of polyimide sheet 202 is in contact with roller 206. Rollers 205 and 206 are rotating in the same direction (i.e., both either clockwise or counter-clockwise), which causes release carrier 204 and polyimide sheet 202 to be transported between rollers 205 and 206 in opposite directions. As release carrier 204 and polyimide sheet 202 pass through rollers 205 and 206, PSA patches 203e, 203f, 203g, 203h, 203i, . . . each come in contact with the first side of polyimide sheet 202. Rollers 205 and 206 can exert sufficient pressure on polyimide sheet 202 and release liner 204 to cause each PSA patch to be automatically transferred from the first side of release liner 204 and sequentially positioned on the first side of polyimide film 202 as shown for PSA patches 203d, 203c, 203b, and 203a.

Figure 7:
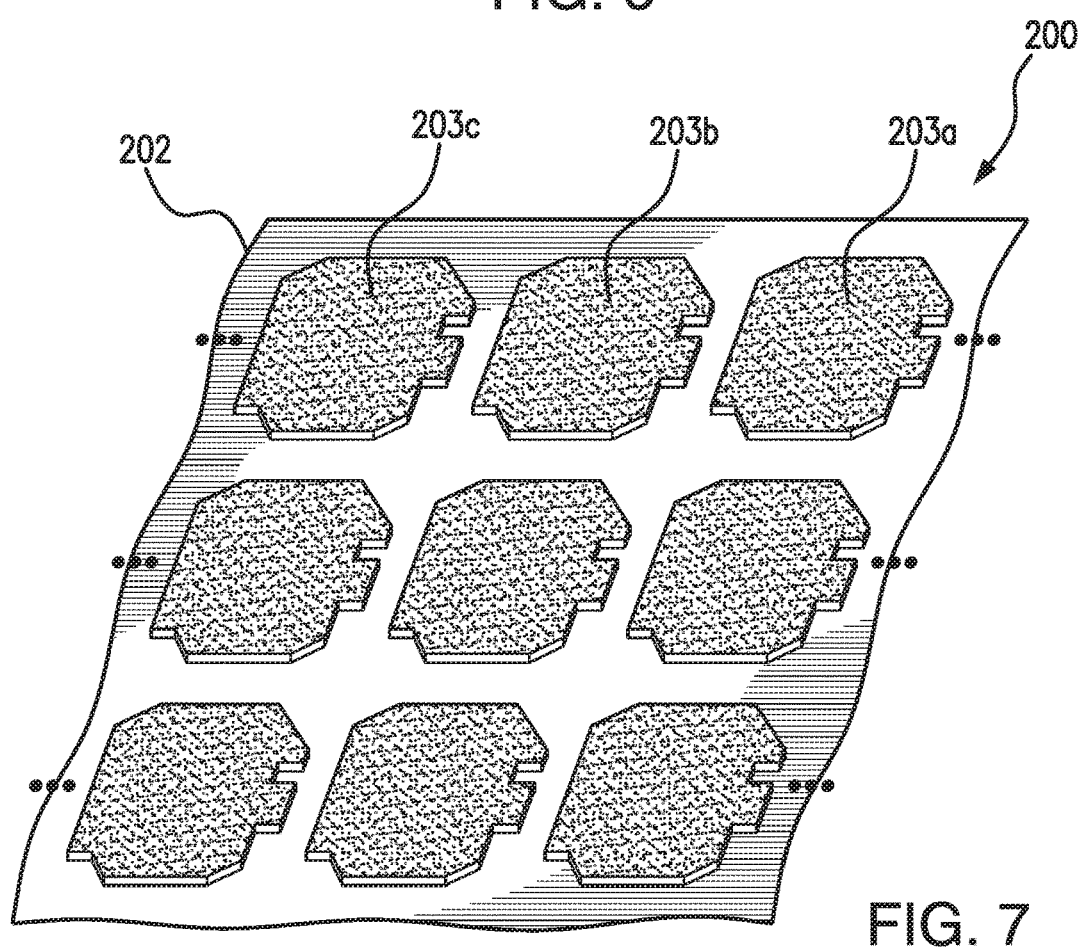
FIG. 7 is a perspective view of a pattern of PSA templates or patches on the surface of the polyimide sheet after attachment by the assembly of FIG. 6.

FIG. 7 is a perspective view of substrate 200 having a pre-selected pattern of PSA templates or patches 203a, 203b, 203c, . . . on pre-determined regions of the surface of polyimide face sheet 202 after attachment by the assembly of FIG. 6.

Figure 8:
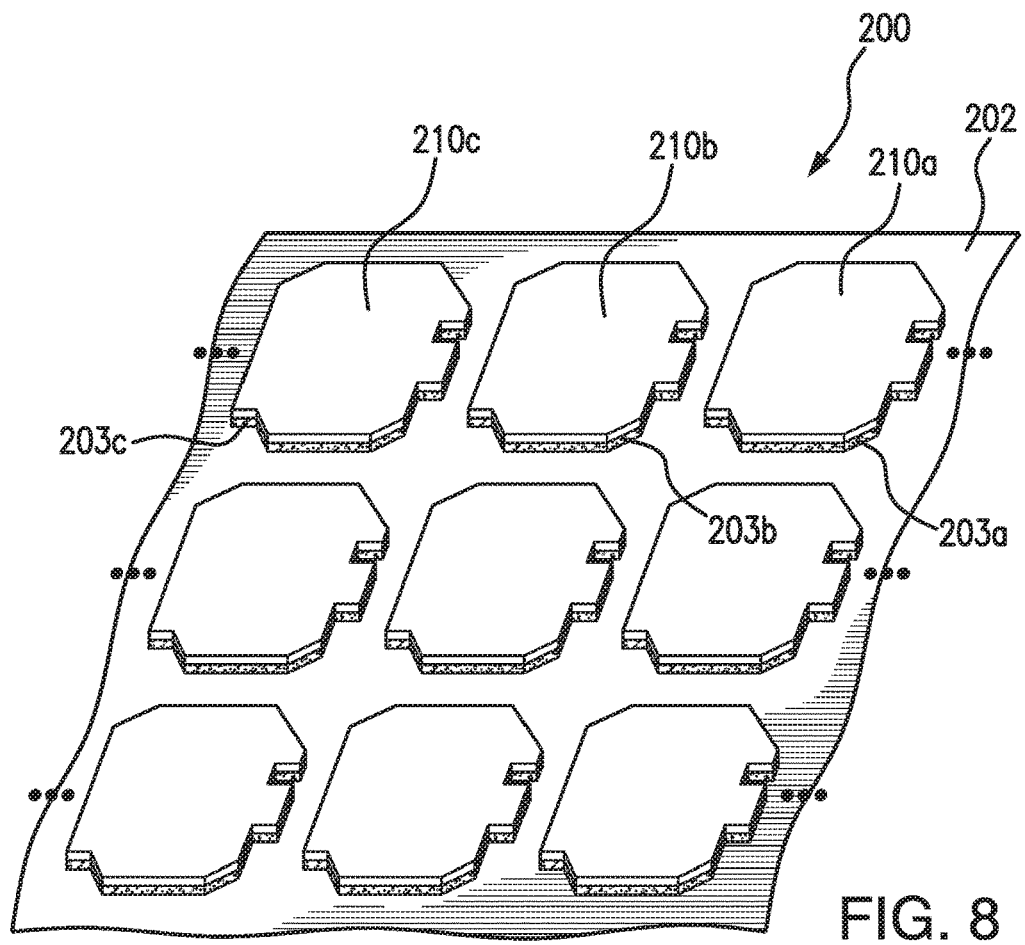
FIG. 8 is a perspective view of an array of solar cells mounted on the PSA templates or patches depicted in FIG. 7.

FIG. 8 is a perspective view of an array of solar cells 210a, 210b, 210c, . . . mounted on the PSA templates or patches 203a, 203b, 203c, . . . , respectively, as depicted in FIG. 7. The array of solar cells 210a, 210b, 210c, . . . can be mounted on the PSA templates or patches 203a, 203b, 203c, . . . , respectively, by a wide variety of methods. For example, the sequence of solar cell assemblies 210a, 210b, 210c, . . . can be disposed on a release carrier, and each solar cell assembly 210a, 210b, 210c, . . . can be detached from the release carrier as the solar cell assembly is bonded to a respective PSA template or patch 203a, 203b, 203c, . . . in a predefined region of polyimide face sheet 202 of substrate 200.

Figure 9:
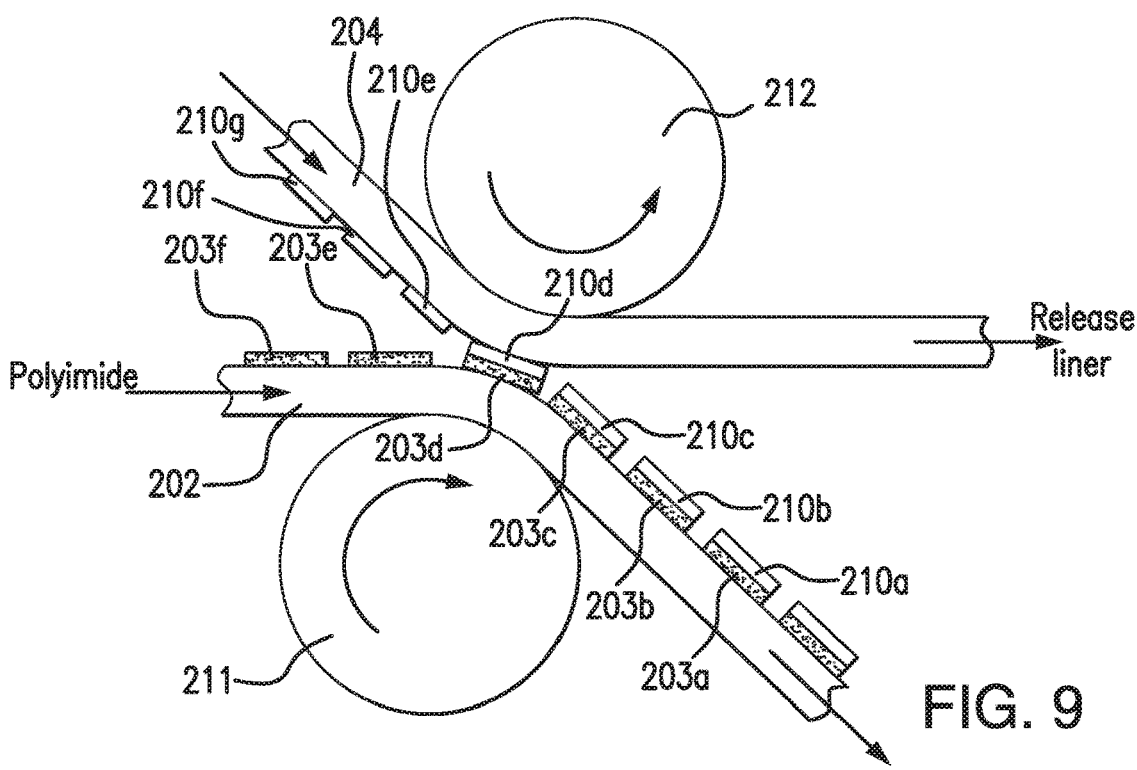
FIG. 9 is a cross sectional view of an automated assembly process for mounting the solar cells on the patterns of PSA patches attached to the polyimide sheet.

FIG. 9 is a cross sectional view of an automated assembly process for mounting the solar cell assemblies on patterns of PSA patches attached to a polyimide sheet. A sequence of solar cell assemblies 210d, 210e, 210f, 210g, . . . are disposed on a first side of release carrier 204. The PSA patches 203a, 203b, 203c, 203d, 203e, 203f, . . . disposed in predefined regions on a first side of polyimide sheet 202 are placed in contact with the sequence of solar cell assemblies 210d, 210e, 210f, 210g, . . . disposed on a first side of release carrier 204. A second side of release carrier 204 is in contact with roller 212, and a second side of polyimide sheet 202 is in contact with roller 211. Rollers 211 and 212 are rotating in the opposite directions (i.e., one clockwise and the other counter-clockwise), which causes release carrier 204 and polyimide sheet 202 to be transported between rollers 211 and 212 in the same direction. As release carrier 204 and polyimide sheet 202 pass through rollers 211 and 212, PSA patches 203a, 203b, 203c, 203d, 203e, 203f, . . . on polyimide sheet 202 each come in contact with solar cell assemblies 210d, 210e, 210f, 210g, . . . disposed on release carrier 204. Rollers 211 and 212 can exert sufficient pressure on polyimide sheet 202 and release liner 204 to cause each solar assembly to be automatically transferred from the first side of release liner 204 and sequentially positioned on PSA patches 203a, 203b, 203c, 203d, 203e, 203f, . . . on the first side of polyimide sheet 202 as shown for solar cell assemblies 210a, 210b, 210c, and 210d adhered to PSA patches 203a, 203b, 203c, and 203d, respectively, on pre-determined regions of the first side of polyimide sheet 202.

Figure 10:
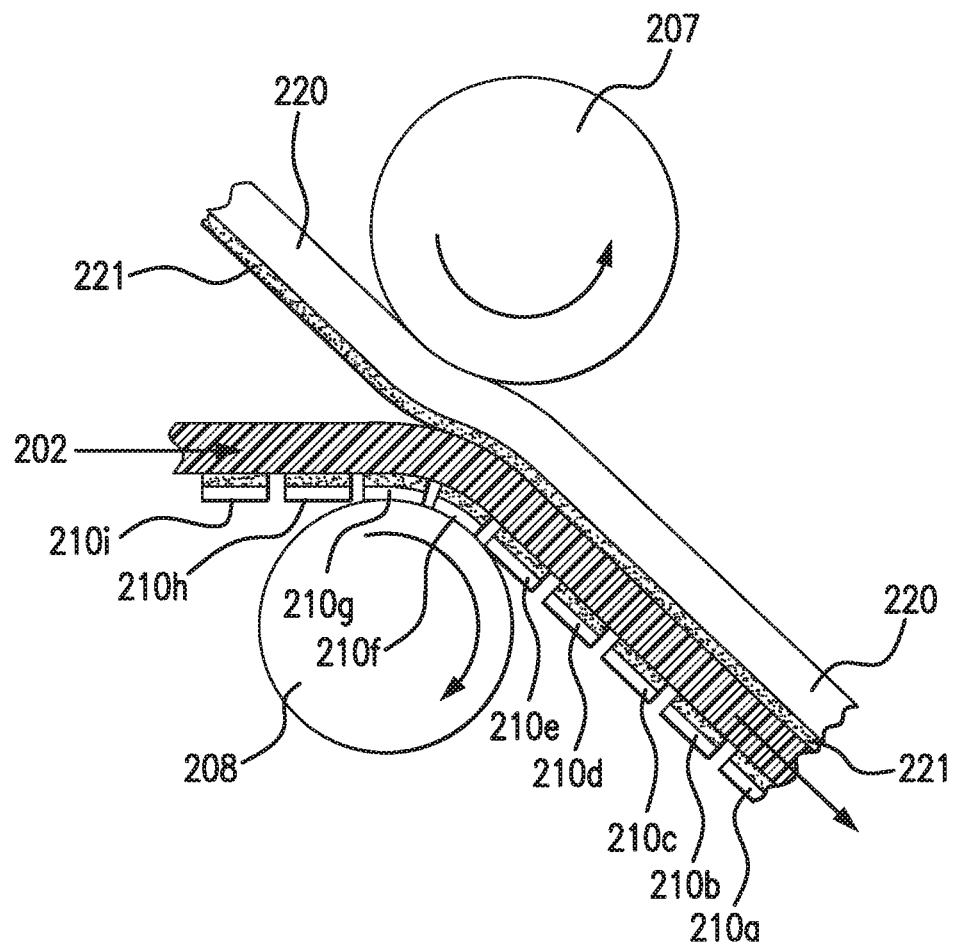
FIG. 10 is a cross sectional view of an automated assembly process for applying a PSA/release liner construction on the side of the polyimide sheet having solar cells mounted thereon.

FIG. 10 is a cross sectional view of an automated assembly process for applying the PSA 221/release liner 220 construction on the side of polyimide sheet 202 opposite solar cell assemblies 210a, 210b, 210c, 210d, 210e, 210f, 210g, 210h, 210i, . . . . In some embodiments, PSA 221 may be a continuous layer adjacent release liner 220. In some other embodiments, PSA 221 may be a patterned layer adjacent release liner 220. The side of the polyimide sheet 202 having solar cell assemblies 210a, 210b, 210c, 210d, 210e, 210f, 210g, 210h, 210i, . . . attached thereto is in contact with roller 208. The side of release liner 220 opposite the side having PSA 221 attached thereto is in contact with roller 207. Rollers 207 and 208 are rotating in opposite directions (i.e., one clockwise and the other counter-clockwise), which causes polyimide sheet 202 and the release liner 220/PSA 221 construction to be transported between rollers 207 and 208 in the same direction. As polyimide sheet 202 and the release liner 220/PSA 221 construction pass through rollers 207 and 208, PSA 221 comes in contact with the side of polyimide sheet 202 opposite solar cell assemblies 210a, 210b, 210c, 210d, 210e, 210f, 210g, 210h, 210i, . . . . Rollers 207 and 208 can exert sufficient pressure on polyimide sheet 202 and the release liner 220/PSA 221 construction to adhere PSA 220 to polyimide sheet 202.

In some embodiments, the solar cell assemblies may have a substantially square or rectangular shape with a dimension (width and/or length) of about 100 µm to 3 cm, in some embodiments, 500 µm to 1 cm, in some embodiments, 1 mm to 5 mm. In other words, the solar cell may have an area of about 0.01 mm$^2$ to 9 cm$^2$, in some embodiments, about 0.25 mm$^2$ to 1 cm$^2$, in some embodiments, about 1 mm$^2$ to 25 mm$^2$. The MIC (the module including an array of cells mounted on a sheet or a support) may have dimensions of about 25 mm by 25 mm to about 600 mm by 600 mm. In some embodiments, the MIC may be about 50 mm by 50 mm to 300 mm by 300 m. In some embodiments, the MIC may be 100 mm by 100 mm to 200 mm by 200 mm.

In other words, in some embodiments of the disclosure the module may have an area of about 600 mm$^2$ to 3600 cm$^2$, in some embodiments about 25 cm$^2$ to 900 cm$^2$, in some embodiments 100 cm$^2$ to 400 cm$^2$.

It is possible to reduce the amount of waste and at the same time achieve a high fill factor by dividing a circular or substantially circular wafer not into one single rectangular, such as square, cell, but into a large number of smaller cells. By dividing a circular or substantially circular wafer into a large amount of relatively small cells, such as rectangular cells, most of the wafer material can be used to produce solar cells, and the waste is reduced. For example, a solar cell wafer having a diameter of 100 mm or 150 mm and a surface area in the order of 80 cm² or 180 cm² can be used to produce a large amount of small solar cells, such as square or rectangular solar cells each having a surface area of less than 9 cm², less than 1 cm², less than 0.1 cm² or even less than 0.05 cm² or less than 0.01 cm². For example, substantially rectangular—such as square—solar cells can be obtained in which the sides are less than 30, 10, 5, 3, 2, 1 or even 0.5 mm long. Thereby, the amount of waste of wafer material can be substantially reduced, and at the same time a high fill factor can be obtained.

Figure 11:
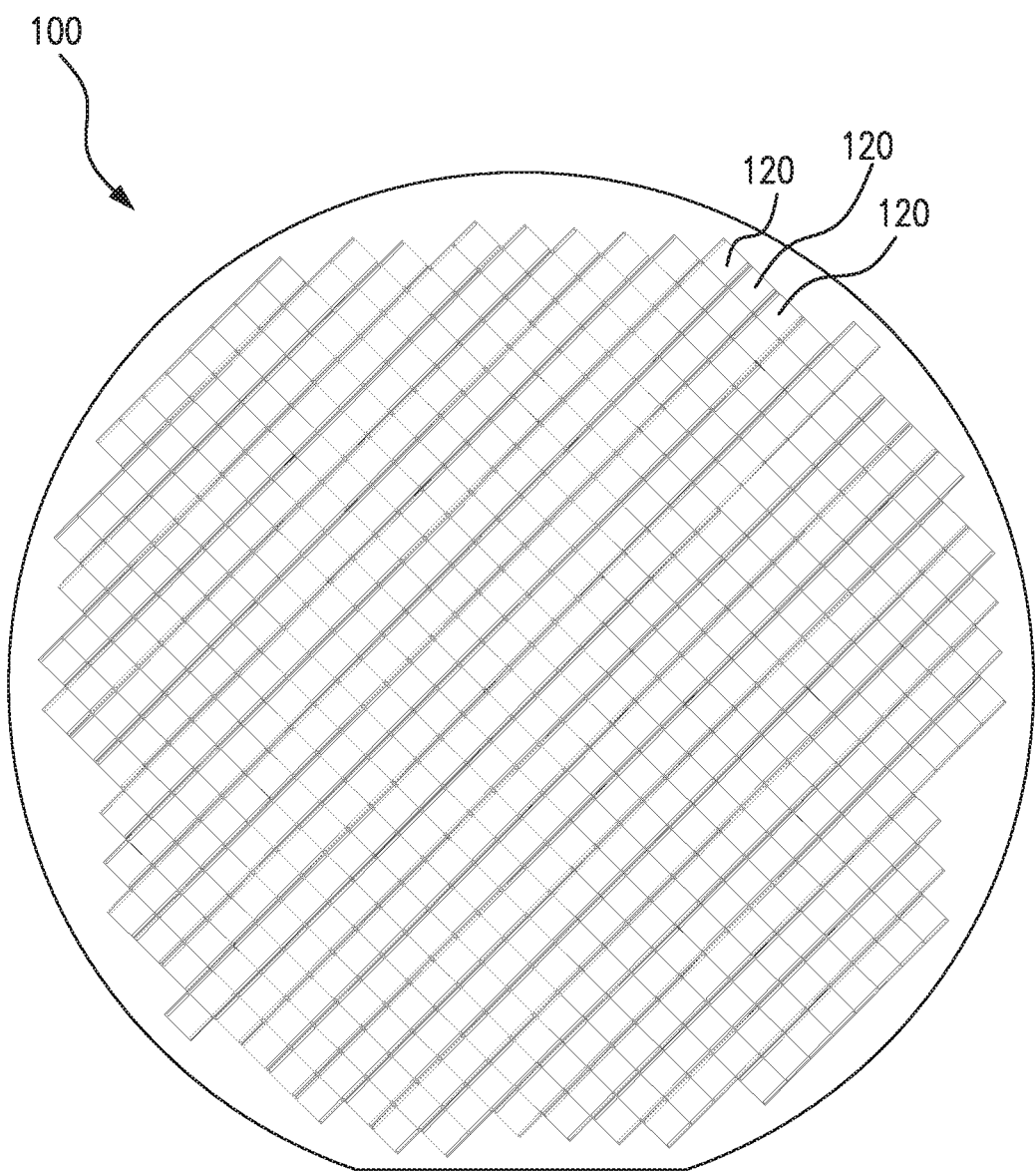
FIG. 11 is a plan view illustrating small solar cell dies cut out from a wafer according to an embodiment of the present disclosure.

FIG. 11 is a plan view illustrating dies 120 with relatively small areas being defined to be diced or cut out from a wafer 100 according an embodiment of the present disclosure. The solar cells 120 may each have an area as described above, for example, of about 0.1 mm² to about 100 mm². As shown, the wasted area of the wafer 100 which cannot be used to fabricate solar cells 120 is significantly reduced compared to other known methods. Specifically, the wafer utilization may be from 88% to 95%. Also, solar cells 120 corresponding to a defective region of the wafer can easily be discarded so as not to impair the performance of the module produced from the solar cells.

Figure 12:
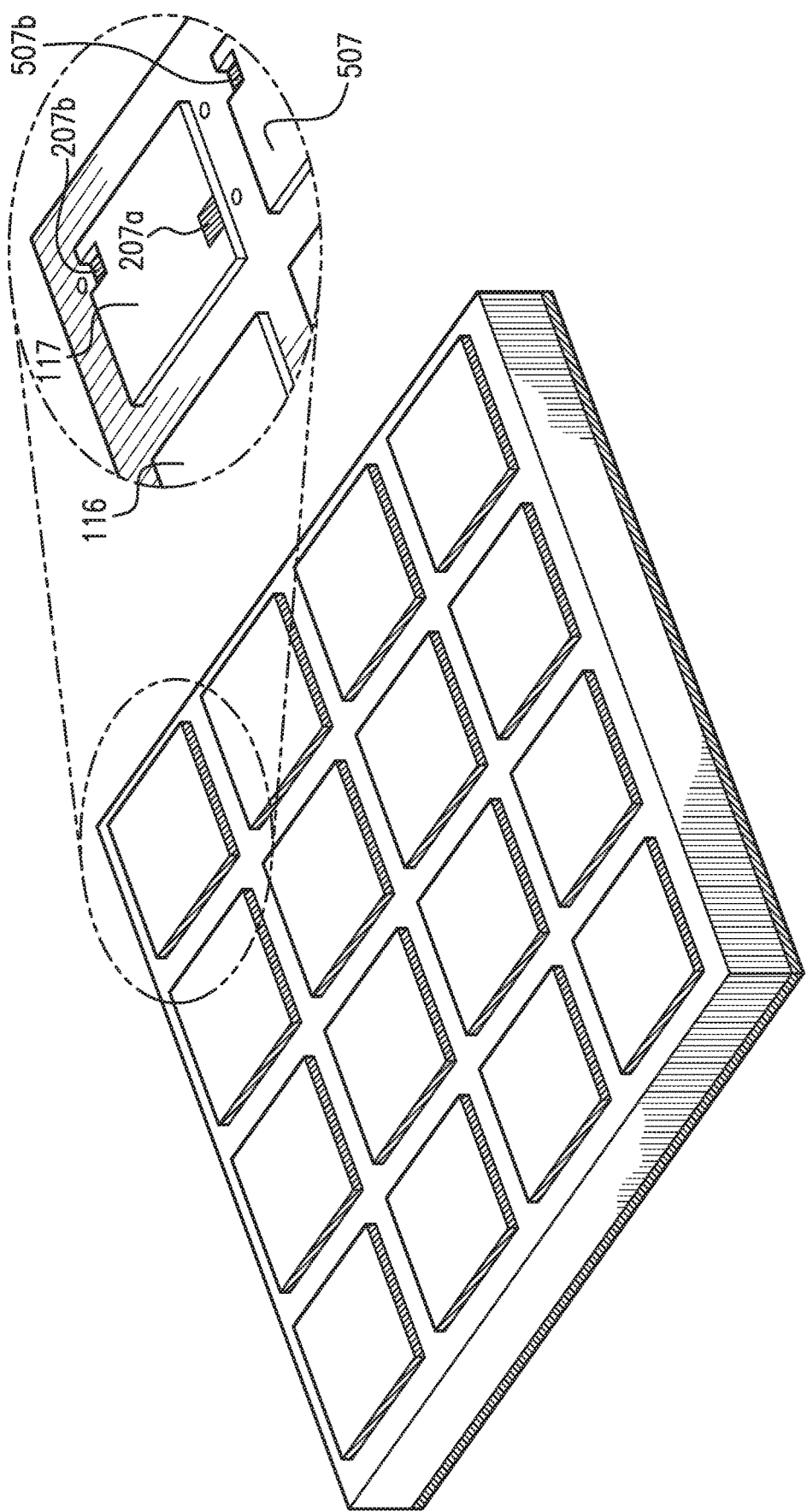
FIG. 12 is a top perspective view of a module with an array of solar cells mounted on a surface.

FIG. 12 is a top perspective view of a module with an array of solar cells 116, 117, . . . , and 507 mounted on the surface of the first side of a support. In the enlarged portion, a contact 207*a* of the first polarity type and two contacts 207*b*, 507*b* of the second polarity type of are shown in relation to two solar cells 117, 507. The solar cells can be conveniently be electrically connected using interconnects as described, for example, in U.S. patent application Ser. No. 14/833,755, filed Aug. 24, 2015.

Figure 13:
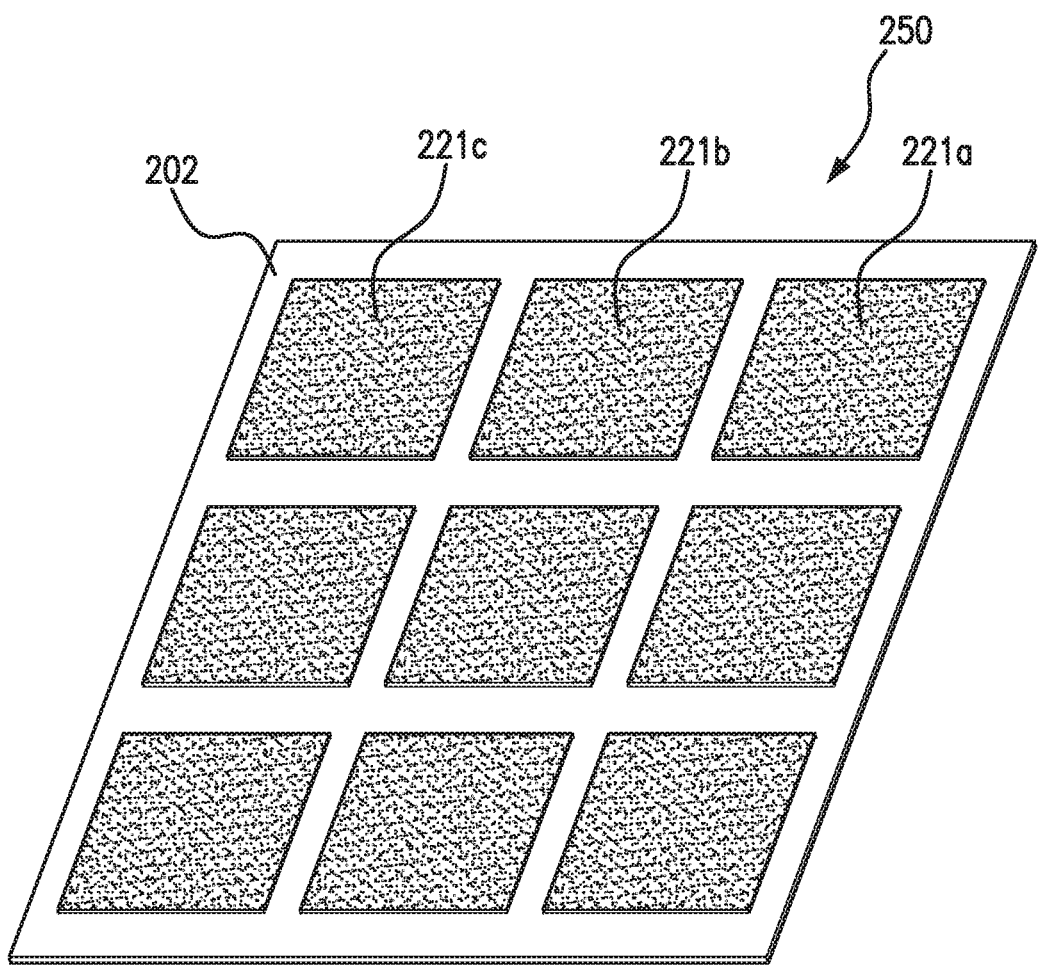
FIG. 13 is a perspective view of a solar cell module with a polyimide sheet having a pattern of PSA patches on the side of the polyimide sheet opposite the solar cells attached thereto.

FIG. 13 is a perspective view of solar cell module 250 with polyimide sheet 202 having a pattern of PSA patches 221*a*, 221*b*, and 221*c* on the side of polyimide sheet 202 opposite solar cells 203*a*, 203*b*, and 203*c*, which can be prepared, for example, as described for FIG. 10. In FIG. 13, release liner 220 has been removed to reveal a pattern of PSA patches.

Polyimide sheets having PSA and a release liner on the side of polyimide sheet opposite the solar cells can conveniently be used to attach the solar cell module to a space vehicle or satellite. For example, the release liner can be removed and the solar cell module can be attached to the surface of the space vehicle or satellite by the application of pressure, either manually or automatically.

CubeSats are a type of miniaturized space vehicles or satellites. A typical CubeSat is a 10 cm×10 cm×10 cm cube, thus having a volume of one liter. CubeSats can be attached to one another in strings or blocks to provide functionalities and capabilities that would not otherwise be practically available in a single CubeSat. For example, one CubeSat can be used as a power source to supply power necessary for other attached CubeSats to perform their functions such as imaging, sensing, or communications.

The solar cell modules described herein can be particularly advantageous for attaching to a CubeSat. For example, the solar cell module can be attached directly to the surface of the CubeSat without a need for a frame (e.g., an aluminum frame). Further the solar cell modules can include a light weight flexible support (e.g., polyimide support) or a non-flexible support (egg shell support).

Figure 14:
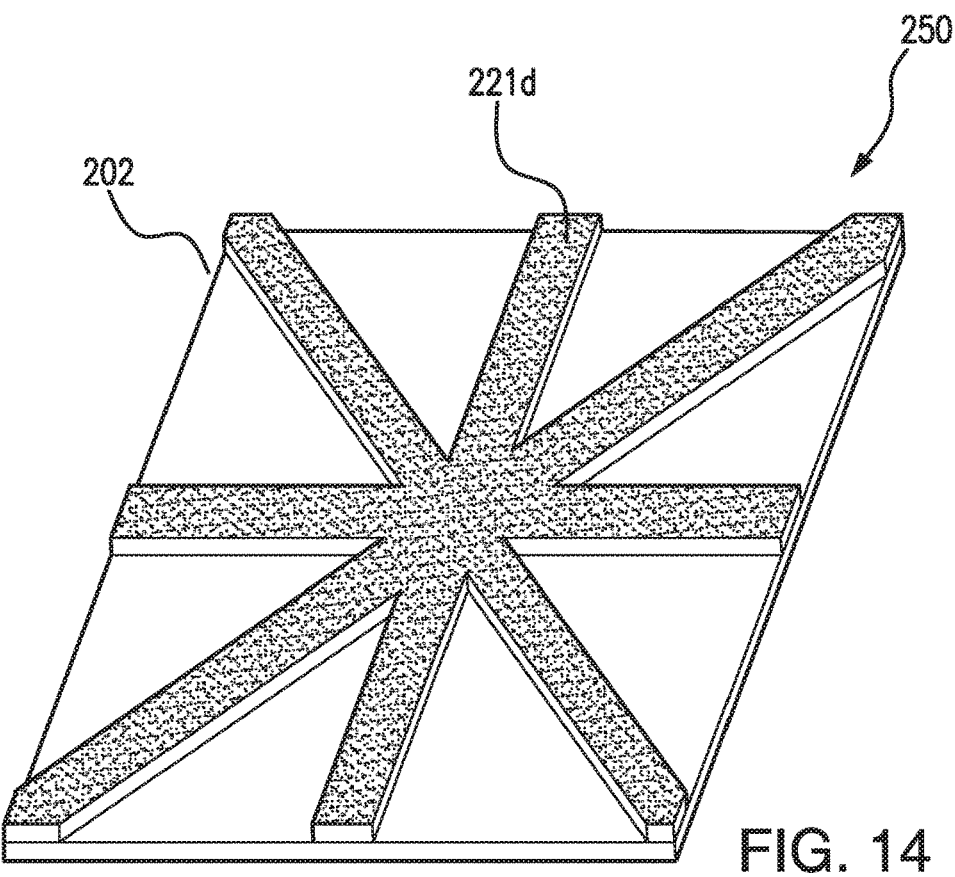
FIG. 14 illustrates an exemplary perspective view of solar cell module having a patterned PSA layer on the polyimide sheet.
Figure 15:
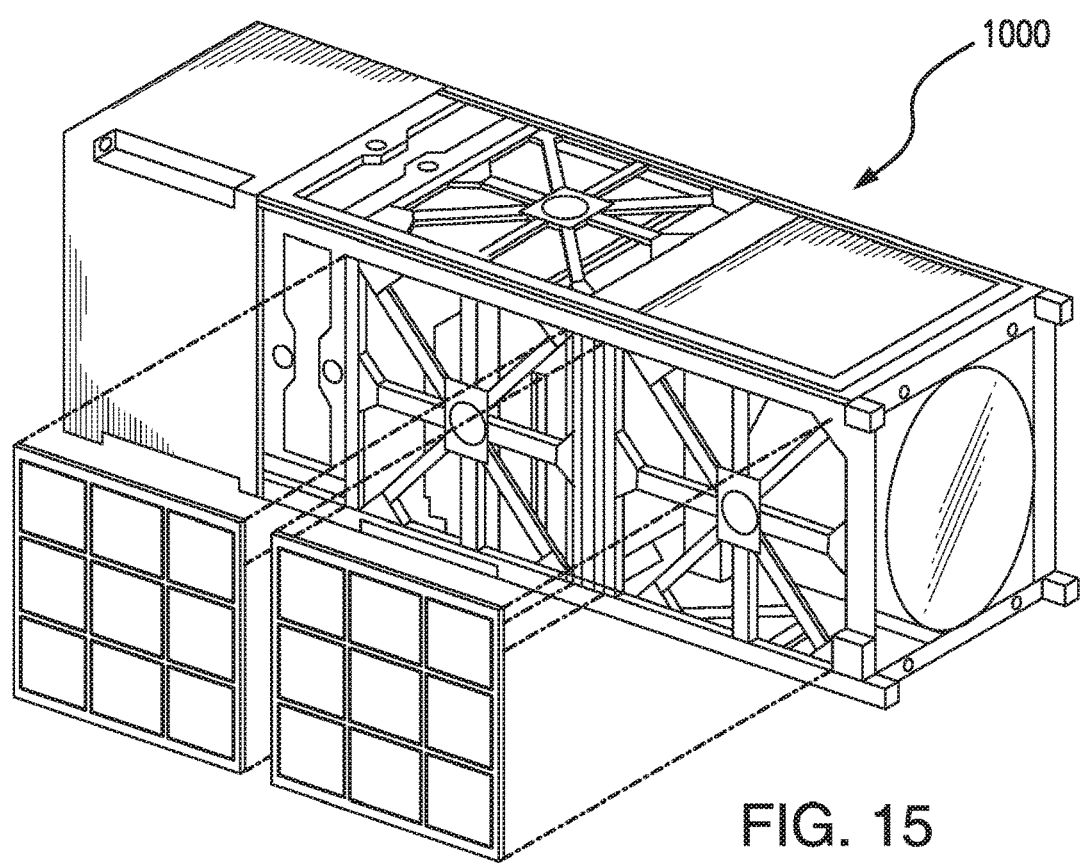
FIG. 15 is a perspective view illustrating mounting the solar cell modules of FIG. 14 on a CubeSat.

The PSA on the polyimide sheets can be a continuous layer or a patterned layer designed for a particular application. For example, FIG. 14 illustrates an exemplary perspective view of solar cell module 250 having a patterned PSA layer on polyimide sheet 202. The particular pattern 221*d* for the PSA in FIG. 14 is designed to match the framework on the surface of a CubeSat 1000 as illustrated in FIG. 15.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The present disclosure can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope of the present disclosure. It should be understood that the above embodiments can be modified without departing from the scope and spirit of the present disclosure which are to be defined by the attached claims.

The invention claimed is:

1. A solar cell array module comprising:
   a solar cell array module having a flexible support including a solar cell bonded to a first side of the flexible support by a double-faced pressure sensitive adhesive (PSA) template or patch that is sized and shaped to match and be congruent to that of a peripheral outline of the solar cell; and
   a pattern of discrete predefined PSA regions on a second side of the flexible support, wherein the discrete predefined PSA regions are mounted adjacent to a surface of a supporting panel and sized to match selected surface portions of the supporting panel.

2. The solar cell array module of claim 1, wherein each of the discrete predefined PSA regions on the second side of the flexible support is shaped and sized to match selected surface portions of a supporting panel of a space vehicle or satellite.

3. The solar cell array module of claim 2 wherein the supporting panel is an aluminum honeycomb substrate having a carbon composite or aluminum face sheet.

4. The solar cell array module of claim 1, wherein the flexible support is composed of a polyimide.

5. The solar cell array module of claim 1, wherein the flexible support is composed of a poly (4,4'-oxydiphenylene-pyromellitimide) material.

6. The solar cell array module of claim 1, wherein a bottom surface of the solar cell is composed of metal and is bonded to the flexible support.

7. The solar cell array module of claim 1, wherein the solar cell has a dimension in the range of 0.5 to 10 mm on a side.

8. The solar cell array module of claim 1, wherein the flexible support has a thickness of between 25 and 100 microns.

9. The solar cell array module of claim 1, wherein the second side of the flexible support is mounted on a metallic honeycomb structure.

10. The solar cell array module of claim 1, wherein the solar cell is bonded to the first side of the flexible support by a single-layer PSA film.

11. The solar cell array module of claim 10, wherein the PSA film is an acrylic or a silicone adhesive.

12. The solar cell array module of claim 1, wherein the discrete predefined PSA regions on the second side of the flexible support are mounted adjacent to a surface of a supporting panel of a satellite or space vehicle.

13. The solar cell array module of claim 1, wherein the discrete predefined PSA regions on the second side of the flexible support are mounted adjacent to a surface of a supporting panel of a CubeSat.

* * * * *